(12) United States Patent
Tailliet

(10) Patent No.: US 12,537,528 B2
(45) Date of Patent: Jan. 27, 2026

(54) ACTIVE CAPACITIVE SHIELD FOR PROGRAMMABLE LOGIC ARRAY

(71) Applicant: STMICROELECTRONICS INTERNATIONAL N.V., Geneva (CH)

(72) Inventor: Francois Tailliet, Fuveau (FR)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 192 days.

(21) Appl. No.: 18/432,610

(22) Filed: Feb. 5, 2024

(65) Prior Publication Data

US 2025/0253852 A1   Aug. 7, 2025

(51) Int. Cl.
  *H03K 19/17704* (2020.01)
(52) U.S. Cl.
  CPC ................. *H03K 19/1772* (2013.01)
(58) Field of Classification Search
  CPC ........... H03K 19/177; H03K 19/17704; H03K 19/17708; H03K 19/1772
  See application file for complete search history.

(56) References Cited

U.S. PATENT DOCUMENTS

| | | | |
|---|---|---|---|
| 6,034,543 A | 3/2000 | Huang et al. | |
| 6,100,714 A * | 8/2000 | Xiao | H03K 19/1776 326/39 |
| 6,622,294 B2 * | 9/2003 | Saxena | G06F 30/394 257/E23.153 |
| 8,166,443 B2 * | 4/2012 | Aoki | G06F 30/394 716/129 |
| 9,583,554 B1 | 2/2017 | Ler et al. | |
| 10,950,277 B1 * | 3/2021 | Nobehara | G11C 8/14 |
| 2002/0076941 A1 * | 6/2002 | Ushiyama | G06F 30/394 438/773 |
| 2006/0125519 A1 * | 6/2006 | Lee | H03K 19/1772 326/41 |
| 2008/0042724 A1 * | 2/2008 | Do | G11C 7/1084 327/333 |
| 2009/0193380 A1 * | 7/2009 | McElvain | G06F 30/394 716/126 |
| 2012/0112563 A1 | 5/2012 | Shido et al. | |
| 2020/0225829 A1 | 7/2020 | Cleary et al. | |

* cited by examiner

*Primary Examiner* — Jason M Crawford
(74) *Attorney, Agent, or Firm* — Alston & Bird LLP

(57) ABSTRACT

In accordance with various embodiments of the present disclosure, a programmable logic array circuit is provided. In some embodiments, the programmable logic array circuit comprises an AND plane comprising a plurality of groups of product term straps, an OR plane comprising a plurality of output lines, a first plurality of dynamically driven shield lines in the AND plane, and a second plurality of dynamically driven shield lines in the OR plane. Each of the plurality of groups of product term straps is adjacent to only one corresponding one of the first plurality of dynamically driven shield lines. Each of the plurality of output lines is adjacent to only one corresponding one of the second plurality of dynamically driven shield lines.

20 Claims, 6 Drawing Sheets

ACTIVE CAPACITIVE SHIELD FOR PROGRAMMABLE LOGIC ARRAY

FIELD OF THE INVENTION

Example embodiments of the present disclosure relate generally to programmable logic arrays and, more particularly, to capacitive shields for programmable logic arrays.

BACKGROUND

Programmable Logic Arrays (PLAs) are area-efficient ways to implement complex combinatory functions. When associated with registers, PLAs make fast, area-efficient Finite State Machines. A typical PLA comprises an AND plane followed by an OR plane. The AND plane generates product terms (ANDs of subsets of inputs). The OR plane generates outputs from ORs of certain product terms. Each output is the sum of a certain group of ANDs of certain inputs.

The AND and OR planes use dynamic, domino logic. The AND plane (which actually uses NAND gates) is decoded when the inputs are valid and stable, its outputs are inverted when the NAND functions are valid and stable, and the OR plane is decoded when the inverted outputs of the NAND gates are valid and stable. An AND clock (typically expressed as "CKA") drives the decoding of the AND gates and an OR clock (typically expressed as "CKO") drives the decoding of the OR gates.

The dense metallic interconnects inside the AND and OR planes (which include the codings of the AND and OR planes and the output lines of the OR plane) create parasitic capacitive couplings that may cause misfunction in the dynamic operation of the PLA. If a product term in the AND plane is decoded, that product term line will fall from a drive voltage Vdd (e.g., 3 VDC) to 0 volts (V). Because of capacitive coupling, the fall from Vdd to 0V in the decoded line tends to make the adjacent line(s) also fall to 0V, which may cause the adjacent line(s) to wrongly appear decoded. Similarly, if a line is decoded in the OR plane and falls from Vdd to 0V, parasitic capacitive coupling will tend to make the adjacent line(s) also fall to 0V, which may cause the adjacent line(s) to wrongly appear decoded.

One approach that has been used to prevent this problem from capacitive coupling is to place a passive shield between each line in the AND plane and between each line and between each output in the OR plane. In this regard, each product term line and each output have a shield on both sides. One drawback of using such an approach to prevent capacitive coupling is that the amount of area taken up by the shields either increases the size of the PLA or reduces the number of inputs, product terms, and outputs that can be provided for the same area.

Applicant has identified many technical challenges and difficulties associated with providing capacitive shielding of PLAs. Through applied effort, ingenuity, and innovation, Applicant has solved problems related to providing capacitive shielding of PLAs by developing solutions embodied in the present disclosure, which are described in detail below.

BRIEF SUMMARY

Various embodiments described herein related to circuits, integrated circuits, methods, apparatuses, and systems for providing capacitive shield for programmable logic arrays.

In accordance with various embodiments of the present disclosure, a programmable logic array circuit is provided.

In some embodiments, the programmable logic array circuit comprises an AND plane comprising a plurality of groups of product term straps, an OR plane comprising a plurality of output lines, a first plurality of dynamically driven shield lines in the AND plane, and a second plurality of dynamically driven shield lines in the OR plane. Each of the plurality of groups of product term straps is adjacent to only one corresponding one of the first plurality of dynamically driven shield lines. Each of the plurality of output lines is adjacent to only one corresponding one of the second plurality of dynamically driven shield lines. In response to a voltage on one or more of the plurality of groups of product term straps falling from a drive voltage to zero volts, a voltage on one or more of the first plurality of dynamically driven shield lines is driven from zero volts to the drive voltage. In response to a voltage on one or more of the plurality of output lines falling from the drive voltage to zero volts, a voltage on one or more of the second plurality of dynamically driven shield lines is driven from zero volts to the drive voltage.

In some embodiments, in response to a voltage on one or more of the plurality of groups of product term straps falling from the drive voltage to zero volts, a voltage on all of the first plurality of dynamically driven shield lines is driven from zero volts to the drive voltage, and, in response to a voltage on one or more of the plurality of output lines falling from the drive voltage to zero volts, a voltage on all of the second plurality of dynamically driven shield lines is driven from zero volts to the drive voltage.

In some embodiments, in response to a voltage on one or more of the plurality of groups of product term straps falling from the drive voltage to zero volts, a voltage on corresponding ones of the first plurality of dynamically driven shield lines is driven from zero volts to the drive voltage, and, in response to a voltage on one or more of the plurality of output lines falling from the drive voltage to zero volts, a voltage on corresponding ones of the second plurality of dynamically driven shield lines is driven from zero volts to the drive voltage.

In some embodiments, the programmable logic array circuit further comprises an AND plane clock and an OR plane clock. The voltage on one or more of the first plurality of dynamically driven shield lines is driven from zero volts to the drive voltage by the AND plane clock and the voltage on one or more of the second plurality of dynamically driven shield lines is driven from zero volts to the drive voltage by the OR plane clock.

In some embodiments, the programmable logic array circuit further comprises first and second inverters in series between the AND plane clock and the one or more of the first plurality of dynamically driven shield lines driven from zero volts to the drive voltage to introduce a phase shift between the AND plane clock and the voltage on one or more of the first plurality of dynamically driven shield lines, and third and fourth inverters in series between the OR plane clock and the one or more of the second plurality of dynamically driven shield lines driven from zero volts to the drive voltage to introduce a phase shift between the OR plane clock and the voltage on one or more of the second plurality of dynamically driven shield lines.

In some embodiments, each of the first plurality of dynamically driven shield lines has a length substantially equal to a length of a corresponding one of the plurality of groups of product term straps, and each of the second plurality of dynamically driven shield lines has a length substantially equal to a length of a corresponding one of the plurality of output lines.

In some embodiments, each of the first plurality of dynamically driven shield lines has a length that is less than half a length of a corresponding one of the plurality of groups of product term straps, and each of the second plurality of dynamically driven shield lines has a length that is less than half a length of a corresponding one of the plurality of output lines.

In accordance with various embodiments of the present disclosure, a method of providing capacitive shielding to a programmable logic array (PLA) circuit is provided. In some embodiments, the method comprises positioning each of a plurality of groups of product term straps of an AND plane of the PLA circuit adjacent to only one corresponding one of a first plurality of dynamically driven shield lines, positioning each of a plurality of output lines of an OR plane of the PLA circuit adjacent to only one corresponding one of a second plurality of dynamically driven shield lines, in response to a voltage on one or more of the plurality of groups of product term straps falling from a drive voltage to zero volts, driving a voltage on one or more of the first plurality of dynamically driven shield lines from zero volts to the drive voltage, and, in response to a voltage on one or more of the plurality of output lines falling from the drive voltage to zero volts, driving a voltage on one or more of the second plurality of dynamically driven shield lines from zero volts to the drive voltage.

In accordance with various embodiments of the present disclosure, an integrated circuit is provided. In some embodiments, the integrated circuit comprises a first plurality of signal lines and a first plurality of dynamically driven shield lines. Each of the first plurality of signal lines is adjacent to only one corresponding one of the first plurality of dynamically driven shield lines. In response to a voltage on one or more of the first plurality of signal lines falling from a drive voltage to zero volts, a voltage on one or more of the first plurality of dynamically driven shield lines is driven from zero volts to the drive voltage.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which.

DETAILED DESCRIPTION OF THE INVENTION

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments, or it may be excluded.

Various embodiments of the present disclosure overcome the above technical challenges and difficulties and provide various technical improvements and advantages based on, for example, but not limited to, providing example circuits, integrated circuits, methods, devices, and systems for providing capacitive shielding of PLAs.

Figure 2A:
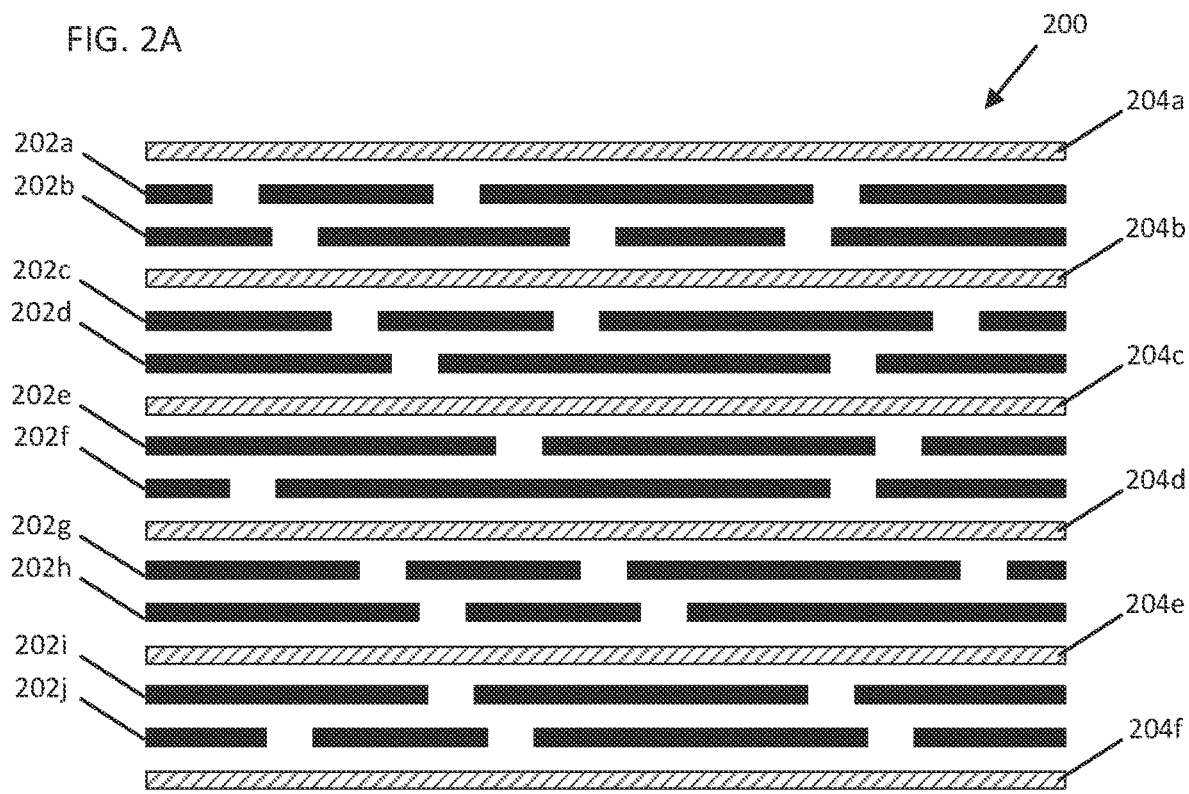
FIGS. 2A and 2B illustrate example active shield configurations, respectively, of an example AND plane and an example OR plane of an example programmable logic array, in accordance with some embodiments of the present disclosure.
Figure 2B:

Various embodiments of the present disclosure provide a PLA circuit, integrated circuit and method in which product terms in the AND plane and the output lines in the OR plane have a capacitive shield on only one side, thereby significantly reducing the number of capacitive shields, and therefore the area used, over the approach described above. (As seen in FIG. 2A, described below, each product term comprises a group of separate but linearly aligned conductors (termed "straps"), each strap shunting one or more than one transistor. As seen in FIG. 2B, described below, each output line comprises a single, straight conductor. The groups of product term straps and the output lines are referred to herein generically as signal lines.) While having a capacitive shield on only one side of each of the groups of product term straps in the AND plane and the output lines in the OR plane (rather than on both sides as in the approach described above) would theoretically restore some of the undesired capacitive coupling that was prevented using the approach described above. However, in various embodiments of the present disclosure, this effect is mitigated by using active shields (which may also be termed "dynamically driven shields") instead of passive shields.

In various embodiments, the active shields are dynamically driven from 0V to Vdd at the same time (or just slightly after) one or more of the decoded lines are driven from Vdd to 0V. The tendency of an undecoded line to fall from Vdd due to capacitive coupling with a nearby decoded line that is falling from Vdd to 0V is mitigated by the capacitive coupling of that undecoded line with an active shield that is simultaneously (or near simultaneously) being driven in the opposite direction. In various embodiments, the signal driving the active shields in the AND plane has a similar phase and amplitude to the AND clock signal CKA, and the signal driving the active shields in the OR plane has a similar phase and amplitude to the OR clock signal CKO.

In various embodiments, all of the active shields are dynamically driven from 0V to Vdd at the same time (or just slightly after) one or more of the decoded lines are driven from Vdd to 0V. In various other embodiments, only the active shields that are adjacent one of the decoded lines is dynamically driven from 0V to Vdd.

In various embodiments, the active shields in the AND plane are dynamically driven from 0V to Vdd by the AND plane clock. In various embodiments, the active shields in the OR plane are dynamically driven from 0V to Vdd by the OR plane clock.

In various embodiments, two inverters in series are positioned between the AND plane clock and one or more of the active shields in the AND plane to introduce a phase shift between the AND plane clock and the voltage on the active shields in the AND plane. In various embodiments, two inverters in series are positioned between the OR plane clock and one or more of the active shields in the OR plane to introduce a phase shift between the OR plane clock and the voltage on the active shields in the OR plane.

In various embodiments, the active shields in the AND plane are substantially the same length as the groups of product term straps and the active shields in the OR plane are substantially the same length as the output lines. In various other embodiments, the active shields in the AND plane are less than half the length of the groups of product term straps and the active shields in the OR plane are less than half the length of the output lines.

Figure 1:
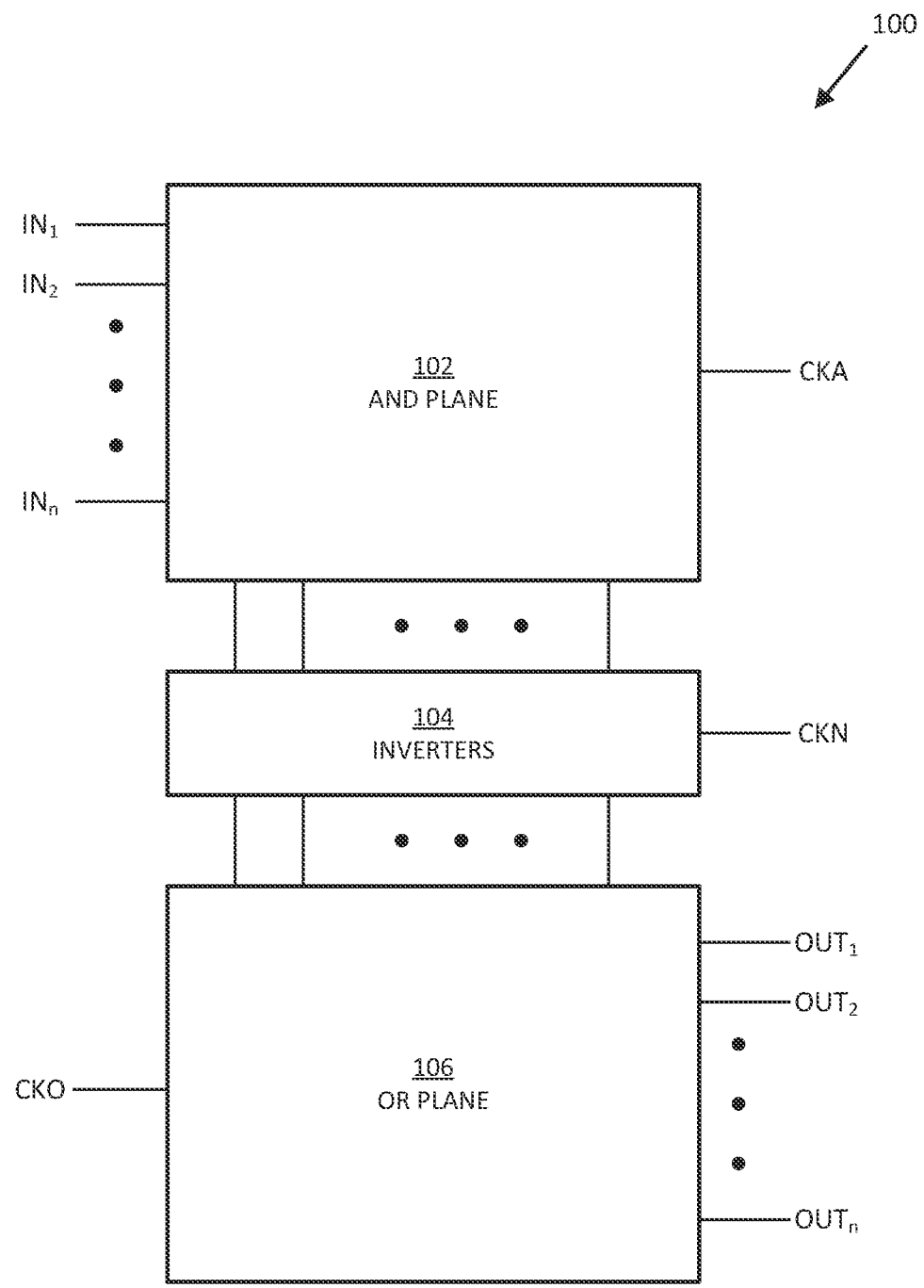
FIG. 1 illustrates a block diagram of an example programmable logic array, in accordance with some embodiments of the present disclosure.

FIG. 1 illustrates an example block diagram of an example programmable logic array, in accordance with some embodiments of the present disclosure. As seen on FIG. 1, an example PLA 100 comprises an AND plane 102, an inverter block 104 comprising a plurality of inverters, and an OR plane 106. In the illustrated embodiment, the AND plane 102 receives a plurality of inputs $IN_1$, $IN_2$, .... $IN_n$ and a clock input CKA. Within the AND plane 102 are a plurality of groups of product term straps and a plurality of active shields, as described further below. The outputs from the groups of product term straps are input into the inverter block 104, inverted, and then provided to the OR plane 106. The inverter block 104 receives a clock input CKN. In the illustrated embodiment, the OR plane 106 receives a clock input CKO and has a plurality of outputs $OUT_1$, $OUT_2$, .... $OUT_n$.

Referring now to FIG. 2A, an example active shield configuration 200 of an example AND plane of an example programmable logic array is illustrated in accordance with some embodiments of the present disclosure. The configuration 200 comprises a plurality of groups of product terms straps 202a-202j and a plurality of active shields 204a-204f. As seen in FIG. 2A, each of the groups of product terms straps 202a-202j is adjacent to another one of the groups of product terms straps and to one of the active shields 204a-204f. For example, group 202a is adjacent to active shield 204a and to group 202b. In the example embodiment of FIG. 2A, the active shields are substantially the same length as the groups of product term straps.

Because the groups 202a-202j do not have a shield on both sides as in the above-described approach that has been used before, there is some capacitive coupling between the adjacent straps of each pair of groups (i.e., between 202a and 202b, between 202c and 202d, etc.). As described above, this coupling is offset by the active shield on the opposite side of each affected group. For example, if group 202c is decoded and the voltage on its straps falls from Vdd to 0V, the voltage on the straps of the adjacent group 202d would also tend to fall due to capacitive coupling. However, in various embodiments of the present disclosure, the voltage on active shield 204c (as well as the voltage on some or all of the other active shields) is driven from 0V to Vdd at the same time or slightly after the voltage on the straps of group 202c falls from Vdd to 0V, thereby preventing or at least reducing the voltage drop on the straps of group 202d (as well as any other undecoded product terms that might otherwise be affected by an adjacent decoded group). In various embodiments of the present disclosure, the voltage drop on the straps of group 202d is reduced enough to prevent line 202d from appearing to be decoded.

Referring now to FIG. 2B, an example active shield configuration 220 of an example OR plane of an example programmable logic array is illustrated in accordance with some embodiments of the present disclosure. The configuration 220 comprises a plurality of output 222a-222j and a plurality of active shields 224a-224f. As seen in FIG. 2B, each of the output lines 222a-222j is adjacent to another one of the output lines and to one of the active shields 224a-224f. For example, output line 222a is adjacent to active shield 224a and to output line 222b. In the example embodiment of FIG. 2B, the active shields are substantially the same length as the output lines.

Because the output lines 222a-222j do not have a shield on both sides as in the above-described approach that has been used before, there is some capacitive coupling between each pair of output lines (i.e., between 222a and 222b, between 222c and 222d, etc.). As described above, this coupling is offset by the active shield on the opposite side of each affected output line. For example, if output line 222c is decoded and its voltage falls from Vdd to 0V, the voltage on the adjacent output line 222d would also tend to fall due to capacitive coupling. However, in various embodiments of the present disclosure, the voltage on active shield 224c (as well as the voltage on some or all of the other active shields) is driven from 0V to Vdd at the same time or slightly after the voltage on output line 222c falls from Vdd to 0V, thereby preventing or at least reducing the voltage drop on output line 222d (as well as any other undecoded output lines that might otherwise be affected by an adjacent decoded output line). In various embodiments of the present disclosure, the voltage drop on output line 222d is reduced enough to prevent output line 222d from appearing to be decoded.

Figure 3:
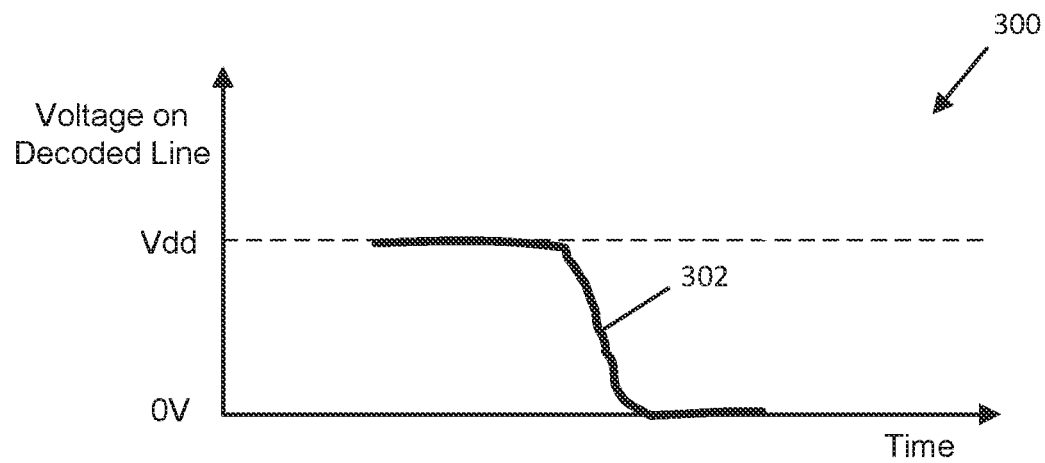
FIG. 3 illustrates example product term or output line and active shield voltages of an example programmable logic array, in accordance with some embodiments of the present disclosure.
Figure 3:
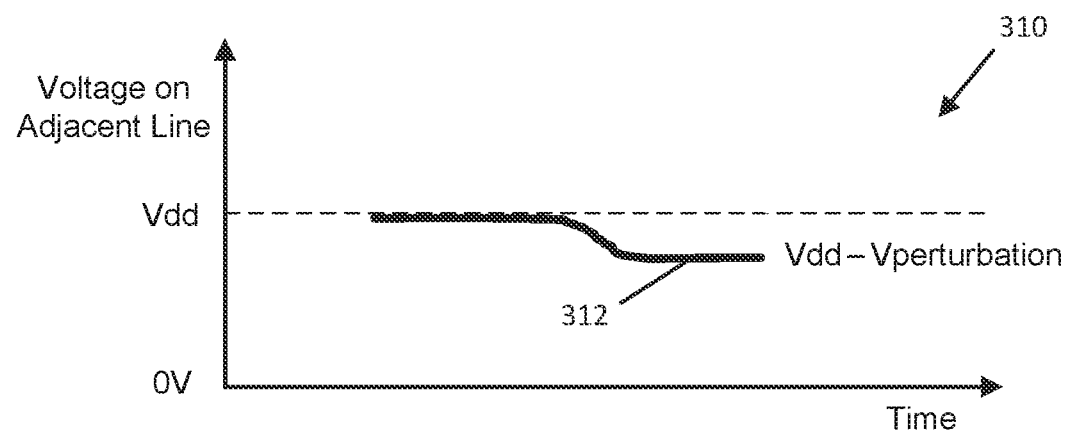
Figure 3:
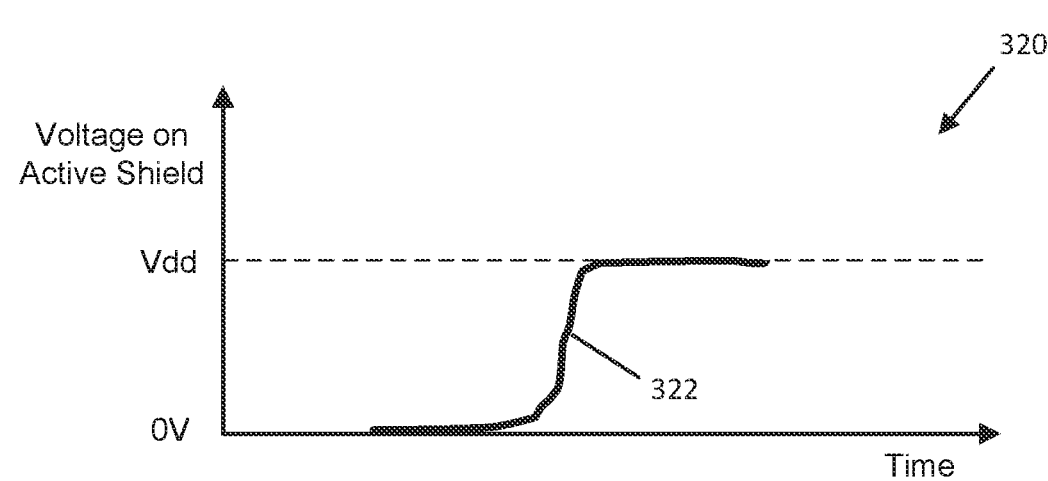

Referring now to FIG. 3, example product term or output line and active shield voltages of an example programmable logic array are illustrated in accordance with some embodiments of the present disclosure. In the example of FIG. 3, graph 300 illustrates the voltage 302 on a decoded line (which may be a group of product term straps of an AND plane or an output line of an OR plane), such as line 202c in the above example; graph 310 illustrates the voltage 312 on an adjacent, undecoded line (which may be a group of product term straps of an AND plane or an output line of an OR plane), such as line 202d in the above example; and graph 320 illustrates the voltage 322 on an active shield that is adjacent the undecoded line, such as active shield 204c in the above example. As seen in FIG. 3, the voltage 302 on a decoded line falls from Vdd to 0V. In response, the voltage 322 on the active shield is driven from 0V to Vdd as seen in graph 320. Due to capacitive coupling between the undecoded line and the active shield, the tendency of the voltage drop on the decoded line to cause a corresponding voltage drop on the undecoded line is offset by the voltage increase on the active shield and its tendency to cause a corresponding voltage increase on the undecoded line. As seen in graph 310 of FIG. 3, this offset limits the voltage drop on the undecoded line such that the undecoded line is not improperly determined to be decoded. In the illustrated embodiment, the voltage drop on the undecoded line is termed Vperturbation, and the resulting voltage on the undecoded line may be expressed as Vdd−Vperturbation. In various embodiments, the undecoded line will likely not be improperly determined to be decoded as long as the resulting voltage on the undecoded line (Vdd−Vperturbation) is greater than the threshold of the output inverter on the undecoded line.

Figure 4:
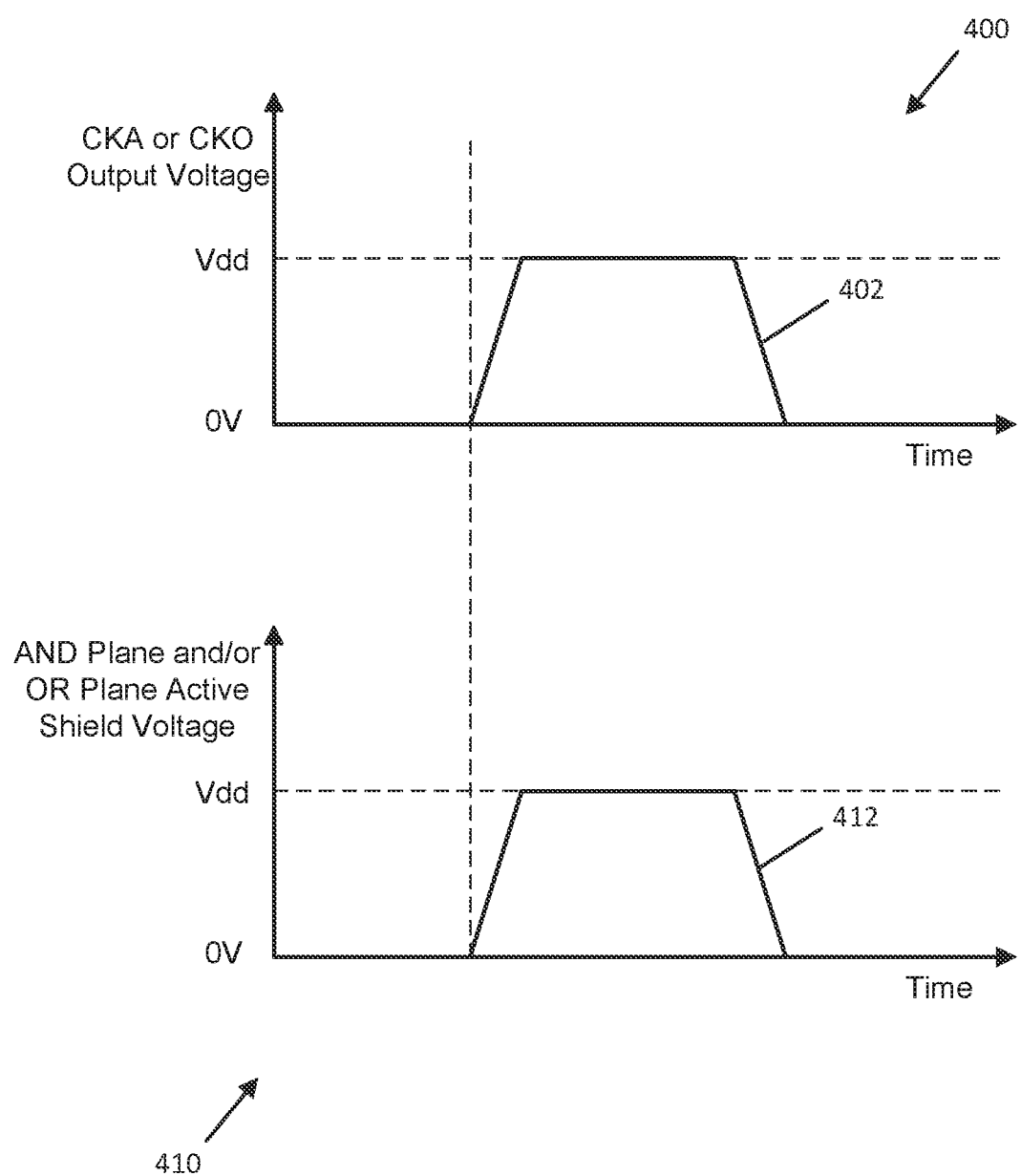
FIG. 4 illustrates example clock and active shield voltages of an example programmable logic array, in accordance with some embodiments of the present disclosure.

As described above, in various embodiments the active shields in the AND plane are dynamically driven from 0V to Vdd by the AND plane clock and/or the active shields in the OR plane are dynamically driven from 0V to Vdd by the OR plane clock. Referring now to FIG. 4, example clock and active shield voltages of an example programmable logic array are illustrated in accordance with some embodiments of the present disclosure. In the example of FIG. 4, graph 400 illustrates the output voltage 402 of an AND plane clock CKA and/or an OR plane clock CKO. As described above, an AND clock drives the decoding of the NAND gates of the AND plane when the inputs are valid and stable and an OR clock drives the decoding of the OR gates when the inverted outputs of the NAND gates are valid and stable. In either case (CKA driving the decoding of the AND plane or CKO driving the decoding of the OR plane), the respective clock drives the decoding by providing a voltage (typically Vdd) for a short period of time as seen in graph 400 of FIG. 4.

As described above, in various embodiments the active shields in the AND plane are dynamically driven from 0V to Vdd by the AND plane clock and/or the active shields in the OR plane arc dynamically driven from 0V to Vdd by the OR plane clock. This is seen in graph 410 of FIG. 4 in which the voltage 412 of the AND plane active shields and/or the OR plane active shields has the same or very similar phase and amplitude as the output voltage 402 of an AND plane clock CKA and/or an OR plane clock CKO. In various embodiments, there may be a slight delay between the output voltage 402 of an AND plane clock CKA and/or an OR plane clock CKO and the voltage 412 provided to the AND plane active shields and/or the OR plane active shields. In a 0.6 µm EEPROM technology, this delay is on the order of about 1 nanosecond (ns).

Figure 5:
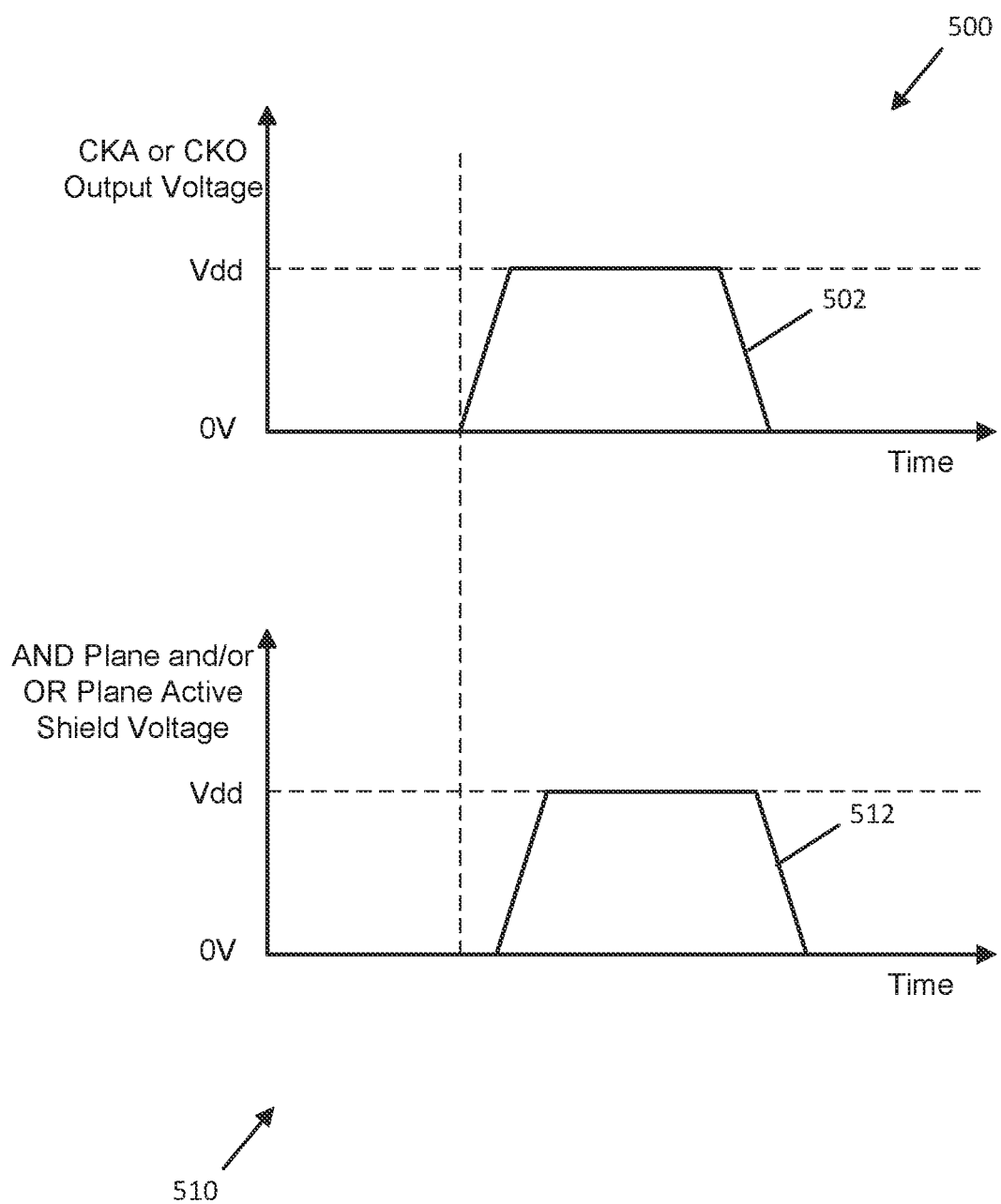
FIG. 5 illustrates example clock and active shield voltages of an example programmable logic array, in accordance with some alternative embodiments of the present disclosure.

As described above, in various embodiments, two inverters in series are positioned between the AND plane clock and one or more of the active shields in the AND plane to introduce a phase shift between the AND plane clock and the voltage on the active shields in the AND plane, and/or two inverters in series are positioned between the OR plane clock and one or more of the active shields in the OR plane to introduce a phase shift between the OR plane clock and the voltage on the active shields in the OR plane. Referring now to FIG. 5, example clock and active shield voltages of an example programmable logic array are illustrated in accordance with some alternative embodiments of the present disclosure. The example of FIG. 5 is similar to the example of FIG. 4, except that in FIG. 5 a phase shift has been introduced by adding two inverters in series between the clock and the active shield. In the example of FIG. 5, graph 500 illustrates the output voltage 502 of an AND plane clock CKA and/or an OR plane clock CKO, while graph 510 illustrates the voltage 512 provided to the active shields. The phase shift between the clock voltage 502 and the active shield voltage 512 introduced by the two inverters is clearly seen in FIG. 5. In various embodiments, the active shields are most effective when they rise at the same time the product term straps or the output lines fall. The product term straps fall with a small delay after the rise of the CKA clock signal, while the output lines fall with a small delay after the rise of the CKO clock signal. Thus, it may be optimal to raise the AND plane shields with a small delay after the rise of the CKA clock signal, and to raise the OR plane shields with a small delay after the rise of the CKO clock signal. In various embodiments, the two chained inverters provide this desired delay. In various embodiments, by playing with the size of the transistors of each inverter, it is possible to trim the delay to fit best the AND/OR plane switching delays with respect to their respective clocks.

Figure 6:
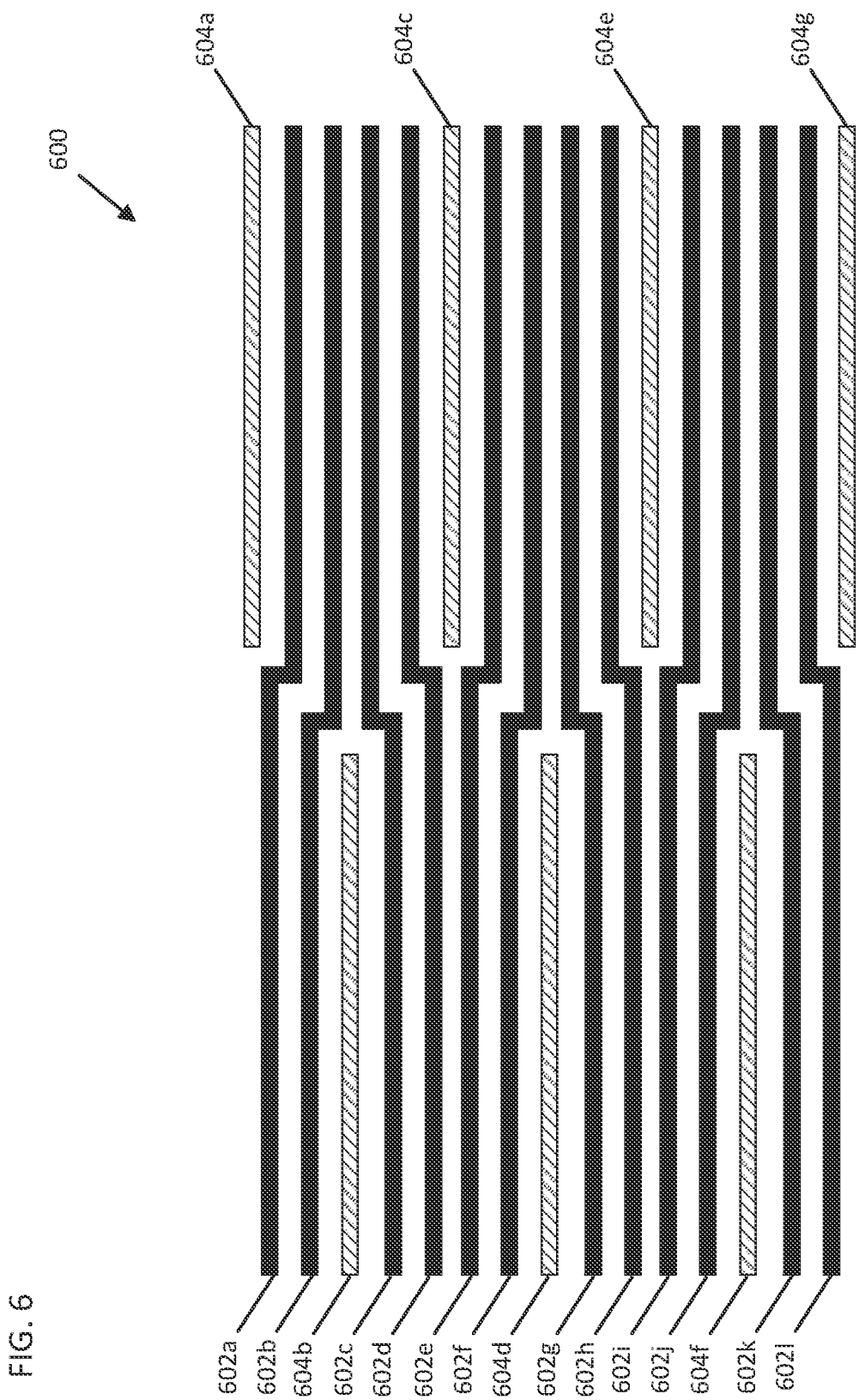
FIG. 6 illustrates an example active shield configuration of an example programmable logic array, in accordance with some alternative embodiments of the present disclosure.

In various embodiments of the present disclosure, the active shields in the AND plane are about half or less than half the length of the groups of product term straps and/or the active shields in the OR plane are about half or less than half the length of the output lines. FIG. 6 illustrates an example active shield configuration of an example OR plane of an example programmable logic array in which the active shields are less than half the length of the output lines and whose positions are staggered. (An example AND plane in such an embodiment would be similar to FIG. 6, but with the output lines 602a-602l replaced by groups of discontinuous product term straps.) By reducing the length of the active shields, the area used for the PLA is reduced even further from the example configuration of FIG. 2 in which the active shields are about the same length as the groups of product term straps and/or the output lines, while still offsetting capacitive coupling enough to prevent an undecoded product term and/or output line from being improperly determined to be decoded.

The configuration 600 of FIG. 6 comprises a plurality of output lines 602a-602l, of an OR plane, and a plurality of active shields 604a-604g. As seen in FIG. 6, each of the output lines 602a-602l is adjacent to another one of the output lines on one side and slightly more than half of another one of the output lines and a slightly less than half length active shield 604a-604f on the other side. For example, output line 602b is adjacent to output line 602a on one side and on the other side to part of output line 602c and active shield 604b. As seen in FIG. 6, the active shields are positionally staggered right and left.

In the illustrated embodiment of FIG. 6, each undecoded output line is capacitively coupled with one full length adjacent line and one partial (approximately half) length adjacent output line on the opposite side. However, the effect on each undecoded output line of its adjacent partial length active shield is still enough to reduce the voltage drop enough to prevent the undecoded output line from appearing to be decoded.

Each signal line of a PLA has three capacitive couplings: (1) with the ground potential, due to the signal running on the substrate, which is at ground, and due to the capacitance of all drains of all the n-type transistors of the PLA connected to the signal line (referred to as Cgnd); (2) with the collection of other adjacent signal lines (potential perturbators) (referred to as Csig_sig); and (3) with the adjacent shield (referred to as Csig_shield). These couplings act as a capacitor bridge. In a worst-case scenario, all of the other signal lines which face the undecoded signal line are decoded and fall from Vdd to 0V. The potential of the undecoded signal (perturbated) is determined as: Vperturbation=Vdd×(Csig_sig−Csig_shield)/(Csig_sig+Csig_shield+Cgnd). To prevent the undecoded line from being improperly interpreted as being decoded, Vdd-Vperturbation should be greater than the threshold of the output inverter on the undecoded line.

For purposes of analyzing the configuration of FIG. 6, we will consider the active shields to be exactly one-half the length of the groups of product term straps and/or output lines. As such, each signal line is adjacent to 1.5 signal lines and 0.5 shields. In this regard, Csig_sig~3×Csig_shield and Vperturbation~Vdd×2×Csig_shield/(4×Csig_shield+Cgnd), which by dividing by 4×Csig_shield can be rewritten as Vperturbation~(Vdd/2)/(1+(Cgnd/(4×Csig_shield))). Thus, in an example configuration such as in FIG. 6, due to the effect of Cgnd, Vperturbation is inferior to Vdd/2, and therefore below the threshold for improperly interpreting a signal line as being decoded.

In various embodiments of the invention, all of the groups of product terms straps and/or all of the output lines may be positioned with an active shield on one side and another line on the opposite side. In various alternative embodiments of the invention, only some of the groups of product terms straps and/or some of the output lines are positioned with an active shield on one side and another line on the opposite side, while others of the groups of product terms straps and/or some of the output lines are positioned with passive shields on both sides.

CONCLUSION

Many modifications and other embodiments of the disclosures set forth herein will come to mind to one skilled in the art to which these disclosures pertain having the benefit of teachings presented in the foregoing descriptions and the associated drawings. Although the figures only show certain components of the apparatus and systems described herein, it is understood that various other components may be used in conjunction with the system. Therefore, it is to be understood that the disclosures are not to be limited to the specific embodiments disclosed and that modifications and other embodiments are intended to be included within the scope of the appended claims. Moreover, the steps in the method described above may not necessarily occur in the order depicted in the accompanying diagrams, and in some cases one or more of the steps depicted may occur substantially simultaneously, or additional steps may be involved. Although specific terms are employed herein, they are used in a generic and descriptive sense only and not for purposes of limitation.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. The disclosed embodiments relate primarily to programmable logic arrays, however, one skilled in the art may recognize that such principles may be applied to any device in which offsetting capacitive coupling is desired. Alternative embodiments that result from combining, integrating, and/or omitting features of the embodiment(s) are also within the scope of the disclosure. Accordingly, the scope of protection is not limited by the description set out above.

Additionally, the section headings used herein are provided for consistency with the suggestions under 37 C.F.R. 1.77 or to otherwise provide organizational cues. These headings shall not limit or characterize the disclosure(s) set out in any claims that may issue from this disclosure.

While this detailed description has set forth some embodiments of the present disclosure, the appended claims cover other embodiments of the present disclosure which differ from the described embodiments according to various modifications and improvements. For example, the appended claims can cover any form of integrated circuit which has one or more programmable logic arrays, such as but not limited to standalone EEPROM memories containing PLAs and/or any other circuit using PLAs, such as microcontrollers and microprocessors.

Within the appended claims, unless the specific term "means for" or "step for" is used within a given claim, it is not intended that the claim be interpreted under 35 U.S.C. 112, paragraph 6.

What is claimed is:

1. A programmable logic array circuit comprising:
an AND plane comprising a plurality of groups of product term straps;
an OR plane comprising a plurality of output lines;
a first plurality of dynamically driven shield lines in the AND plane; and
a second plurality of dynamically driven shield lines in the OR plane;
wherein each of the plurality of groups of product term straps is adjacent to only one corresponding one of the first plurality of dynamically driven shield lines;
wherein each of the plurality of output lines is adjacent to only one corresponding one of the second plurality of dynamically driven shield lines;

wherein, in response to a voltage on one or more of the plurality of groups of product term straps falling from a drive voltage to zero volts, a voltage on one or more of the first plurality of dynamically driven shield lines is driven from zero volts to the drive voltage; and wherein, in response to a voltage on one or more of the plurality of output lines falling from the drive voltage to zero volts, a voltage on one or more of the second plurality of dynamically driven shield lines is driven from zero volts to the drive voltage.

2. The programmable logic array circuit of claim 1, wherein, in response to a voltage on one or more of the plurality of groups of product term straps falling from the drive voltage to zero volts, a voltage on all of the first plurality of dynamically driven shield lines is driven from zero volts to the drive voltage; and wherein, in response to a voltage on one or more of the plurality of output lines falling from the drive voltage to zero volts, a voltage on all of the second plurality of dynamically driven shield lines is driven from zero volts to the drive voltage.

3. The programmable logic array circuit of claim 1, wherein, in response to a voltage on one or more of the plurality of groups of product term straps falling from the drive voltage to zero volts, a voltage on corresponding ones of the first plurality of dynamically driven shield lines is driven from zero volts to the drive voltage; and wherein, in response to a voltage on one or more of the plurality of output lines falling from the drive voltage to zero volts, a voltage on corresponding ones of the second plurality of dynamically driven shield lines is driven from zero volts to the drive voltage.

4. The programmable logic array circuit of claim 1, further comprising:

an AND plane clock; and an OR plane clock;

wherein the voltage on one or more of the first plurality of dynamically driven shield lines is driven from zero volts to the drive voltage by the AND plane clock; and wherein the voltage on one or more of the second plurality of dynamically driven shield lines is driven from zero volts to the drive voltage by the OR plane clock.

5. The programmable logic array circuit of claim 4, further comprising:

first and second inverters in series between the AND plane clock and the one or more of the first plurality of dynamically driven shield lines driven from zero volts to the drive voltage to introduce a phase shift between the AND plane clock and the voltage on one or more of the first plurality of dynamically driven shield lines; and third and fourth inverters in series between the OR plane clock and the one or more of the second plurality of dynamically driven shield lines driven from zero volts to the drive voltage to introduce a phase shift between the OR plane clock and the voltage on one or more of the second plurality of dynamically driven shield lines.

6. The programmable logic array circuit of claim 1, wherein each of the first plurality of dynamically driven shield lines has a length substantially equal to a length of a corresponding one of the plurality of groups of product term straps; and wherein each of the second plurality of dynamically driven shield lines has a length substantially equal to a length of a corresponding one of the plurality of output lines.

7. The programmable logic array circuit of claim 1, wherein each of the first plurality of dynamically driven shield lines has a length that is less than half a length of a corresponding one of the plurality of groups of product term straps; and wherein each of the second plurality of dynamically driven shield lines has a length that is less than half a length of a corresponding one of the plurality of output lines.

8. A method of providing capacitive shielding to a programmable logic array (PLA) circuit, the method comprising:

positioning each of a plurality of groups of product term straps of an AND plane of the PLA circuit adjacent to only one corresponding one of a first plurality of dynamically driven shield lines;

positioning each of a plurality of output lines of an OR plane of the PLA circuit adjacent to only one corresponding one of a second plurality of dynamically driven shield lines;

in response to a voltage on one or more of the plurality of groups of product term straps falling from a drive voltage to zero volts, driving a voltage on one or more of the first plurality of dynamically driven shield lines from zero volts to the drive voltage; and in response to a voltage on one or more of the plurality of output lines falling from the drive voltage to zero volts, driving a voltage on one or more of the second plurality of dynamically driven shield lines from zero volts to the drive voltage.

9. The method of claim 8, wherein, in response to a voltage on one or more of the plurality of groups of product term straps falling from the drive voltage to zero volts, a voltage on all of the first plurality of dynamically driven shield lines is driven from zero volts to the drive voltage; and wherein, in response to a voltage on one or more of the plurality of output lines falling from the drive voltage to zero volts, a voltage on all of the second plurality of dynamically driven shield lines is driven from zero volts to the drive voltage.

10. The method of claim 8, wherein, in response to a voltage on one or more of the plurality of groups of product term straps falling from the drive voltage to zero volts, a voltage on corresponding ones of the first plurality of dynamically driven shield lines is driven from zero volts to the drive voltage; and wherein, in response to a voltage on one or more of the plurality of output lines falling from the drive voltage to zero volts, a voltage on corresponding ones of the second plurality of dynamically driven shield lines is driven from zero volts to the drive voltage.

11. The method of claim 8, wherein the voltage on one or more of the first plurality of dynamically driven shield lines is driven from zero volts to the drive voltage by an AND plane clock of the PLA circuit; and wherein the voltage on one or more of the second plurality of dynamically driven shield lines is driven from zero volts to the drive voltage by an OR plane clock of the PLA circuit.

12. The method of claim 11, further comprising:

inserting first and second inverters in series between the AND plane clock and the one or more of the first plurality of dynamically driven shield lines driven from zero volts to the drive voltage to introduce a phase shift between the AND plane clock and the voltage on one or more of the first plurality of dynamically driven shield lines; and inserting third and fourth inverters in series between the OR plane clock and the one or more of the second plurality of dynamically driven shield lines driven from zero volts to the drive voltage to introduce a phase shift between the OR plane clock and the voltage on one or more of the second plurality of dynamically driven shield lines.

13. The method of claim 8, wherein each of the first plurality of dynamically driven shield lines has a length substantially equal to a length of a corresponding one of the plurality of groups of product term straps; and wherein each of the second plurality of dynamically driven shield lines has a length substantially equal to a length of a corresponding one of the plurality of output lines.

14. The method of claim 8, wherein each of the first plurality of dynamically driven shield lines has a length that is less than half a length of a corresponding one of the plurality of groups of product term straps; and wherein each of the second plurality of dynamically driven shield lines has a length that is less than half a length of a corresponding one of the plurality of output lines.

15. An integrated circuit comprising:

a first plurality of signal lines; and a first plurality of dynamically driven shield lines;

wherein each of the first plurality of signal lines is adjacent to only one corresponding one of the first plurality of dynamically driven shield lines; and wherein, in response to a voltage on one or more of the first plurality of signal lines falling from a drive voltage to zero volts, a voltage on one or more of the first plurality of dynamically driven shield lines is driven from zero volts to the drive voltage.

16. The integrated circuit of claim 15, further comprising:

a second plurality of signal lines; and a second plurality of dynamically driven shield lines;

wherein each of the second plurality of signal lines is adjacent to only one corresponding one of the second plurality of dynamically driven shield lines; and wherein, in response to a voltage on one or more of the second plurality of signal lines falling from a drive voltage to zero volts, a voltage on one or more of the second plurality of dynamically driven shield lines is driven from zero volts to the drive voltage.

17. The integrated circuit of claim 16, wherein the integrated circuit comprises a programmable logic array (PLA) circuit;

wherein the first plurality of signal lines comprises a plurality of groups of product term straps of an AND plane of the PLA circuit; and wherein the second plurality of signal lines comprises a plurality of output lines of an OR plane of the PLA circuit.

18. The integrated circuit of claim 17, wherein, in response to a voltage on one or more of the plurality of groups of product term straps falling from the drive voltage to zero volts, a voltage on all of the first plurality of dynamically driven shield lines is driven from zero volts to the drive voltage; and wherein, in response to a voltage on one or more of the plurality of output lines falling from the drive voltage to zero volts, a voltage on all of the second plurality of dynamically driven shield lines is driven from zero volts to the drive voltage.

19. The integrated circuit of claim 17, wherein, in response to a voltage on one or more of the plurality of groups of product term straps falling from the drive voltage to zero volts, a voltage on corresponding ones of the first plurality of dynamically driven shield lines is driven from zero volts to the drive voltage; and wherein, in response to a voltage on one or more of the plurality of output lines falling from the drive voltage to zero volts, a voltage on corresponding ones of the second plurality of dynamically driven shield lines is driven from zero volts to the drive voltage.

20. The integrated circuit of claim 17, further comprising:

an AND plane clock; and an OR plane clock;

wherein the voltage on one or more of the first plurality of dynamically driven shield lines is driven from zero volts to the drive voltage by the AND plane clock; and wherein the voltage on one or more of the second plurality of dynamically driven shield lines is driven from zero volts to the drive voltage by the OR plane clock.

* * * * *